(12) United States Patent
Li et al.

(10) Patent No.: US 10,043,826 B1
(45) Date of Patent: Aug. 7, 2018

(54) FULLY DEPLETED SILICON ON INSULATOR INTEGRATION

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/660,288

(22) Filed: Jul. 26, 2017

(51) Int. Cl.
| | |
|---|---|
| *H01L 29/423* | (2006.01) |
| *H01L 27/12* | (2006.01) |
| *H01L 29/08* | (2006.01) |
| *H01L 29/36* | (2006.01) |
| *H01L 29/10* | (2006.01) |
| *H01L 29/06* | (2006.01) |
| *H01L 29/78* | (2006.01) |
| *H01L 29/45* | (2006.01) |
| *H01L 21/762* | (2006.01) |
| *H01L 29/66* | (2006.01) |

(Continued)

(52) U.S. Cl.
CPC .... *H01L 27/1203* (2013.01); *H01L 21/02378* (2013.01); *H01L 21/02444* (2013.01); *H01L 21/26513* (2013.01); *H01L 21/6835* (2013.01); *H01L 21/76283* (2013.01); *H01L 21/84* (2013.01); *H01L 29/0653* (2013.01); *H01L 29/0847* (2013.01); *H01L 29/1033* (2013.01); *H01L 29/1095* (2013.01); *H01L 29/36* (2013.01); *H01L 29/45* (2013.01); *H01L 29/665* (2013.01); *H01L 29/66575* (2013.01); *H01L 29/7831* (2013.01); *H01L 29/7833* (2013.01); *H01L 21/82345* (2013.01); *H01L 29/42356* (2013.01); *H01L 29/66484* (2013.01); *H01L 2221/68345* (2013.01); *H01L 2221/68381* (2013.01)

(58) Field of Classification Search
CPC ......... H01L 21/82345; H01L 29/42356; H01L 29/66484
USPC .......................................................... 257/366
See application file for complete search history.

(56) References Cited

U.S. PATENT DOCUMENTS

| | | |
|---|---|---|
| 8,030,145 B2 | 10/2011 | Chang et al. |
| 8,507,989 B2 | 8/2013 | Khakifirooz et al. |

(Continued)

*Primary Examiner* — George Fourson, III
(74) *Attorney, Agent, or Firm* — Patterson & Sheridan, LLP

(57) ABSTRACT

Certain aspects of the present disclosure generally relate to a semiconductor device. The semiconductor device generally includes a substrate, a first non-insulative region disposed above the substrate, and a second non-insulative region disposed above the first non-insulative region, wherein the first and second non-insulative regions have the same doping type and different doping concentrations. In certain aspects, the semiconductor device also includes a first dielectric layer, a channel region, the first dielectric layer being disposed adjacent to a first side of the channel region, a second dielectric layer disposed adjacent to a second side of the channel region, and a third non-insulative region disposed above the second dielectric layer. In certain aspects, the semiconductor device also includes a fourth non-insulative region disposed adjacent to a third side of the channel region, and a fifth non-insulative region disposed adjacent to a fourth side of the channel region.

15 Claims, 19 Drawing Sheets

(51) Int. Cl.
*H01L 21/265* (2006.01)
*H01L 21/84* (2006.01)
*H01L 21/683* (2006.01)
*H01L 21/02* (2006.01)
*H01L 21/8234* (2006.01)

(56) References Cited

U.S. PATENT DOCUMENTS

| | | | |
|---|---|---|---|
| 8,508,283 B2 | 8/2013 | Kawahara et al. | |
| 9,281,305 B1 | 3/2016 | Yang et al. | |
| 9,385,708 B2 | 7/2016 | Agrawal | |
| 2007/0029620 A1* | 2/2007 | Nowak | H01L 21/743 257/369 |
| 2007/0284628 A1* | 12/2007 | Kapoor | H01L 29/41775 257/270 |
| 2008/0191277 A1* | 8/2008 | Disney | H01L 29/0638 257/343 |
| 2009/0010056 A1* | 1/2009 | Kuo | G11C 16/0408 365/184 |
| 2010/0006823 A1* | 1/2010 | Anderson | H01L 29/1606 257/24 |
| 2010/0032769 A1* | 2/2010 | Hao | H01L 21/761 257/378 |
| 2011/0171792 A1* | 7/2011 | Chang | G03F 9/7084 438/157 |
| 2011/0215860 A1* | 9/2011 | Mazure | H01L 27/1203 327/537 |
| 2012/0018806 A1* | 1/2012 | Furukawa | H01L 21/84 257/347 |
| 2012/0146148 A1* | 6/2012 | Iwamatsu | H01L 21/84 257/351 |
| 2013/0049116 A1* | 2/2013 | Zhu | H01L 21/84 257/347 |
| 2013/0119470 A1* | 5/2013 | Horita | H01L 29/78 257/347 |
| 2015/0001623 A1* | 1/2015 | Wang | H01L 29/78654 257/347 |
| 2015/0061006 A1* | 3/2015 | Shinohara | H01L 29/7824 257/336 |
| 2015/0091060 A1* | 4/2015 | Yang | H01L 29/66431 257/194 |
| 2015/0287740 A1* | 10/2015 | Bedell | H01L 29/7848 257/351 |

* cited by examiner

FULLY DEPLETED SILICON ON INSULATOR INTEGRATION

TECHNICAL FIELD

Certain aspects of the present disclosure generally relate to semiconductor devices and, more particularly, to metal-oxide semiconductor (MOS) devices.

BACKGROUND

A fully-depleted silicon on insulator (FD-SOI) is a planar process technology to fabricate a transistor having a thin layer of insulator (e.g., buried oxide) and a thin silicon film for the transistor channel. The depletion region of a FD-SOI transistor may cover the whole channel such that the channel is fully depleted. FD-SOI improves the transistor electrostatic characteristics as compared to conventional bulk technology and lowers the parasitic capacitance between the source and the drain. The thin channel also confines the electron flow from the source to the drain, reducing leakage currents.

SUMMARY

Certain aspects of the present disclosure generally relate to a semiconductor device and techniques for fabricating the same.

Certain aspects of the present disclosure provide a semiconductor device. The semiconductor device generally includes a substrate; a first non-insulative region disposed above the substrate; a second non-insulative region disposed above the first non-insulative region, where the first and second non-insulative regions have the same doping type and different doping concentrations; a first dielectric layer; a channel region, where the first dielectric layer is disposed adjacent to a first side of the channel region; a second dielectric layer disposed adjacent to a second side of the channel region; a third non-insulative region disposed above the second dielectric layer; a fourth non-insulative region disposed adjacent to a third side of the channel region; and a fifth non-insulative region disposed adjacent to a fourth side of the channel region.

Certain aspects of the present disclosure provide a method for fabricating a semiconductor device. The method generally includes forming a channel region on a graphene layer; removing the channel region from the graphene layer; forming a first non-insulative region in a substrate; forming a first dielectric layer on the substrate; disposing the channel region on the first dielectric layer such that the first dielectric layer is disposed adjacent to a first side of the channel region; forming a second dielectric layer adjacent to a second side of the channel region; and forming a second non-insulative region on the second dielectric layer.

Certain aspects of the present disclosure provide a mobile device. The mobile device generally includes one or more semiconductor devices, each of the semiconductor devices including: a substrate; a first non-insulative region disposed above the substrate; a second non-insulative region disposed above the first non-insulative region, where the first and second non-insulative regions have the same doping type and different doping concentrations; a first dielectric layer; a channel region, where the first dielectric layer is disposed adjacent to a first side of the channel region; a second dielectric layer disposed adjacent to a second side of the channel region; a third non-insulative region disposed above the second dielectric layer; a fourth non-insulative region disposed adjacent to a third side of the channel region; and a fifth non-insulative region disposed adjacent to a fourth side of the channel region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to techniques for fabricating a planar dual-gate semiconductor device using a graphene layer to thin down the back gate oxide, improving back gate controllability, and lowering the back gate voltage for low power applications.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Body thickness control and uniformity is difficult to obtain when fabricating a thin silicon channel (e.g., about 7 nm) for a fully depleted silicon on insulator (FD-SOI) semiconductor device. The thin silicon body may result in higher source and drain extension parasitic resistance. Moreover, the thick buried oxide (BOX) (e.g., ten times thicker than front gate oxide) results in less back gate control and higher back gate voltage (e.g., 1-2V), resulting in increased power consumption. The gate length scaling is also limited due to less back gate control.

Certain aspects of the present disclosure use a graphene layer transfer process to thin down the back gate oxide (e.g., to obtain a similar thickness as the front gate oxide), improving the back gate controllability, and reducing the back gate bias voltage to reduce the power consumption of the semiconductor device. Aspects of the present disclosure also allow for fabrication of a thick channel, reducing the source and drain extension resistance, allowing for higher current flow. Moreover, the back gate can be operated separately as the front gate, enabling more operating modes for the semiconductor device.

Figure 1:
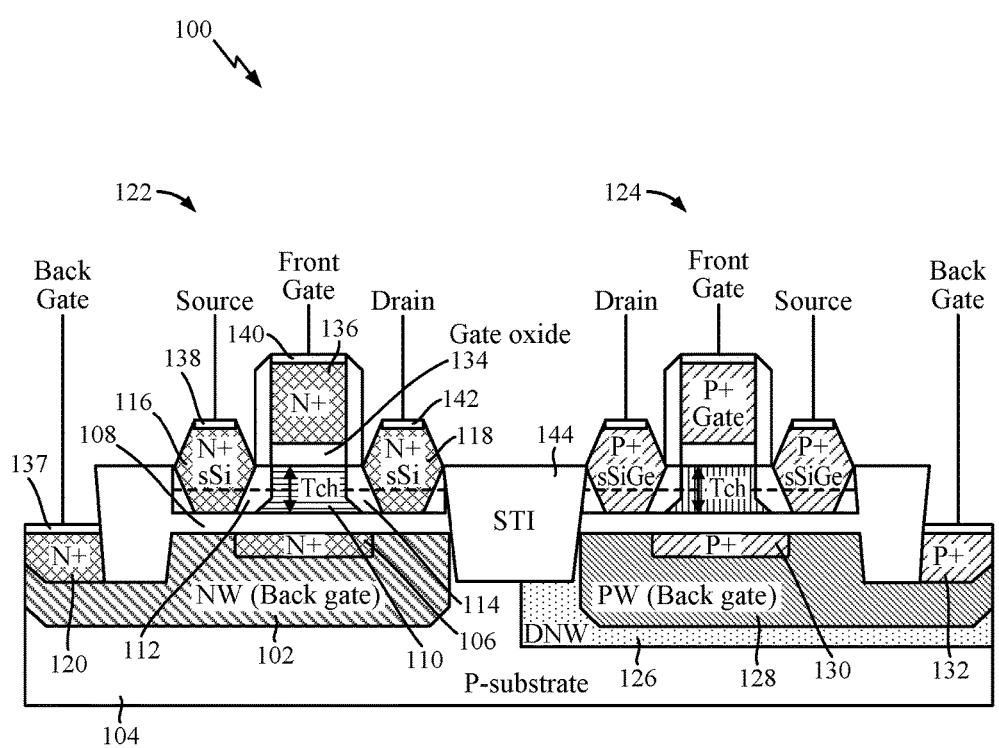
FIG. 1 illustrates a cross-section of an example semiconductor device, in accordance with certain aspects of the present disclosure.

FIG. 1 illustrates an example semiconductor device 100, in accordance with certain aspects of the present disclosure. The semiconductor device 100 includes an example planar double-gate n-channel metal-oxide semiconductor (NMOS) device 122 and an example planar double-gate p-channel metal-oxide semiconductor (PMOS) device 124. The NMOS device 122 includes front and back gate regions. The back gate region is implemented using an n-well (NW) region 102 over a substrate 104 (e.g., p-type substrate). The NW region 102 is also adjacent to an n+ region 106 that is adjacent to a back gate oxide 108 and an N+ region 120 to drive the back gate. As illustrated, the semiconductor device 100 can be implemented with a channel thickness (Tch) that is thicker than conventional semiconductor devices (e.g., at least twice as thick as a conventional fully depleted silicon on insulator (FD-SOI) device). The semiconductor device 100 also includes lightly doped regions 112 and 114 adjacent to the source and drain regions (e.g., N+ regions 116 and 118), respectively. The front gate region includes an oxide layer 134 (e.g., a dielectric layer) and an N+ gate electrode region 136. Silicide layers 137, 138, 140, and 142 are disposed over N+ regions 120, 116, 136 and 118, respectively, allowing for source, gate and drain contact to be coupled to N+ regions 120, 116, 136 and 118.

The PMOS device 124 is implemented with a similar configuration as the NMOS device 122, as illustrated, but with the front gate, back gate, source, and drain regions implemented using p-type semiconductor regions. In certain aspects, the PMOS device 124 may include a deep n-well (DNW) region 126, over which the back gate region, including the p-well (PW) region 128 and P+ regions 130 and 132, is formed. As illustrated, the NMOS device 122 and the PMOS device 124 are separated by a shallow trench isolation (STI) region 144.

Figure 2A:
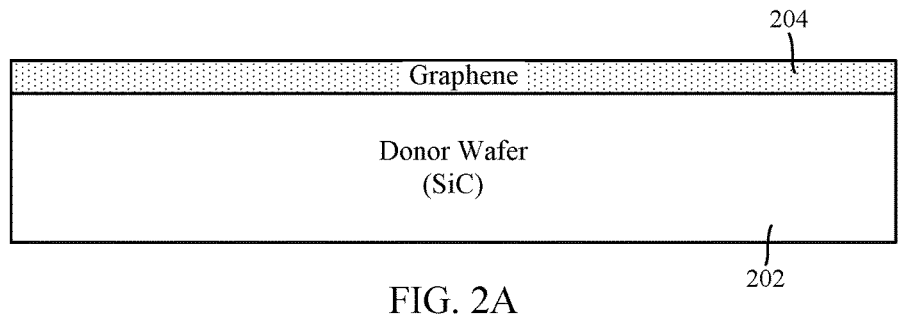
FIGS. 2A-2T illustrate a process for fabricating a semiconductor device, in accordance with certain aspects of the present disclosure.
Figure 2B:
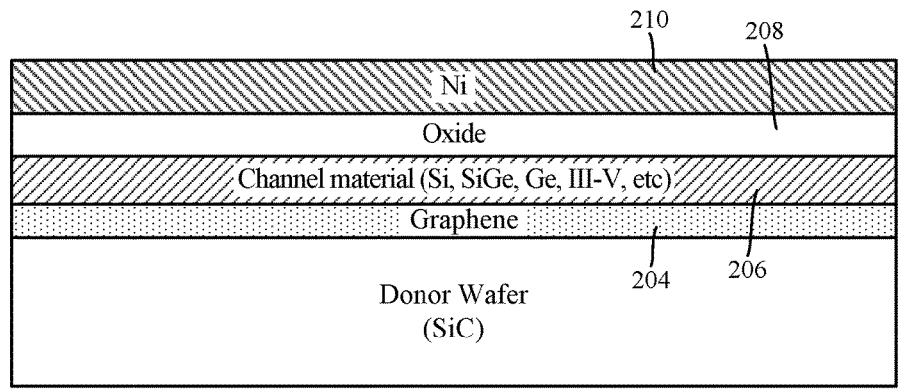
Figure 2C:
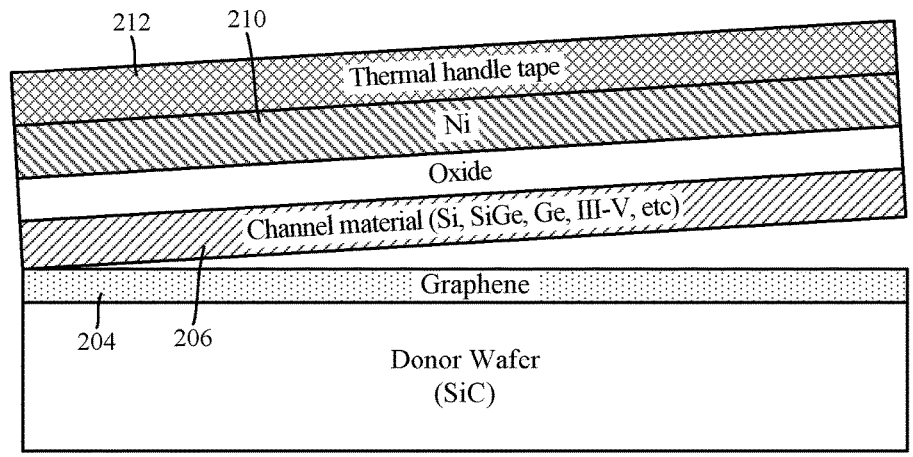
Figure 2D:
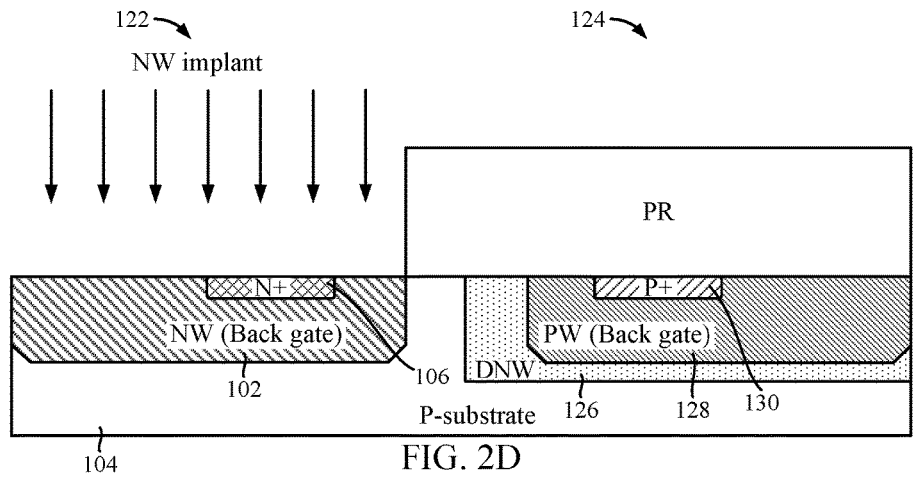
Figure 2E:
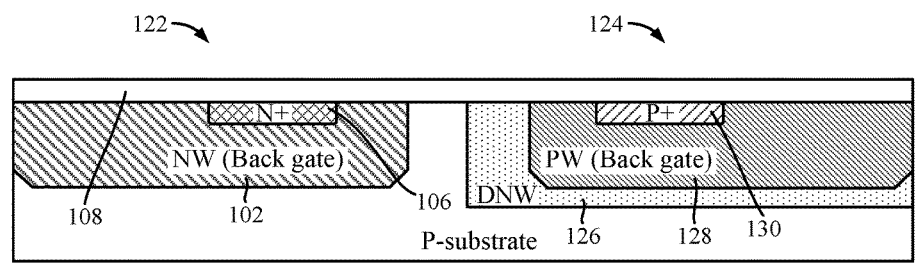
Figure 2F:
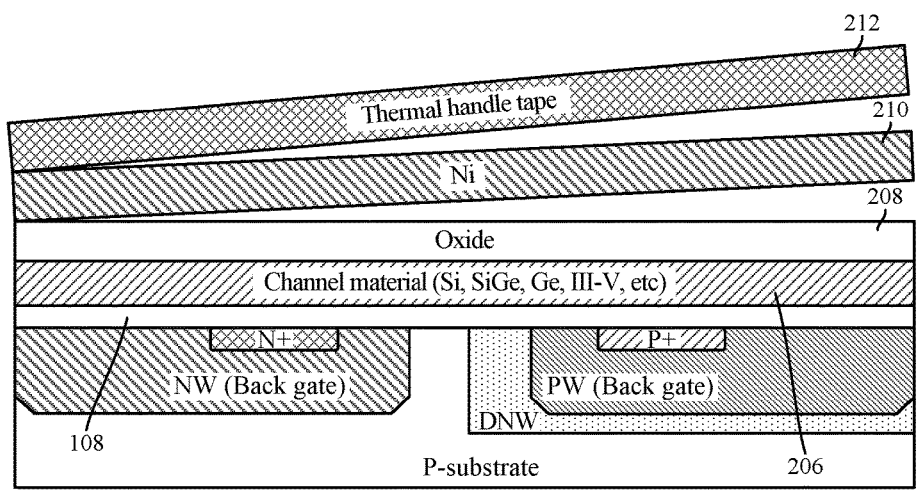
Figure 2G:
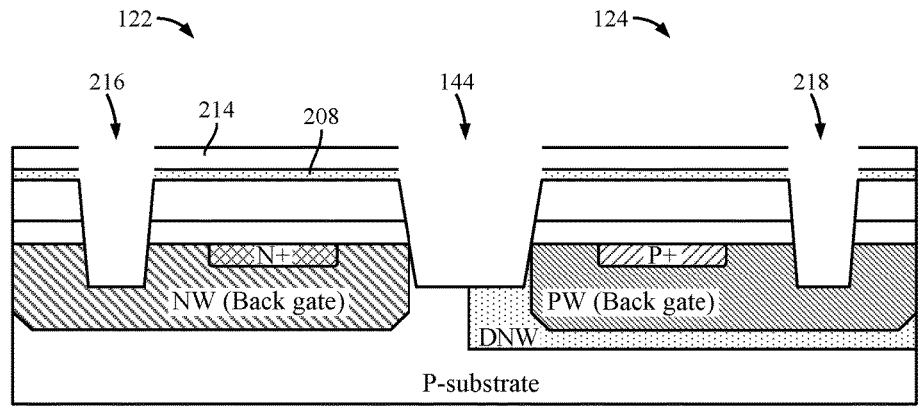
Figure 2H:
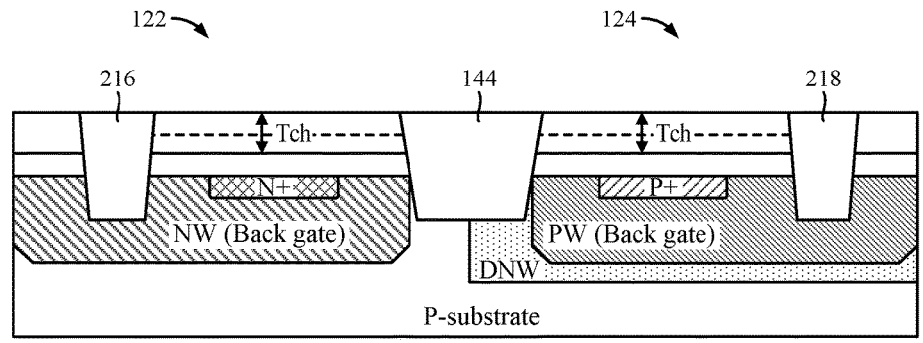
Figure 2I:
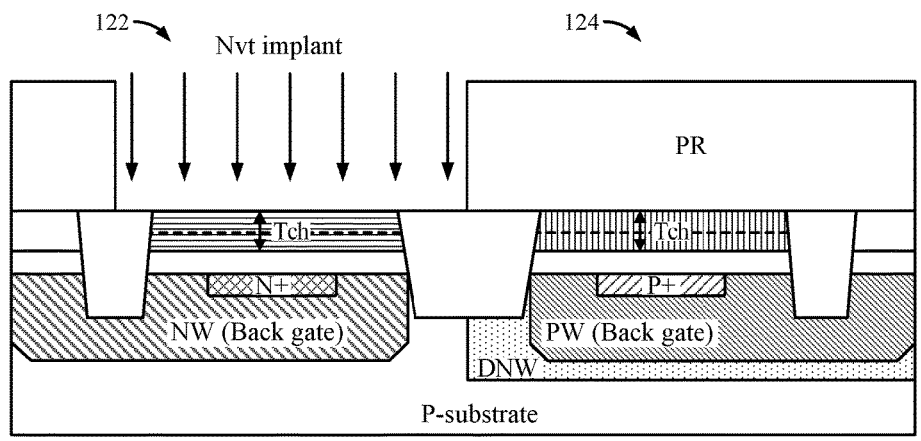
Figure 2J:
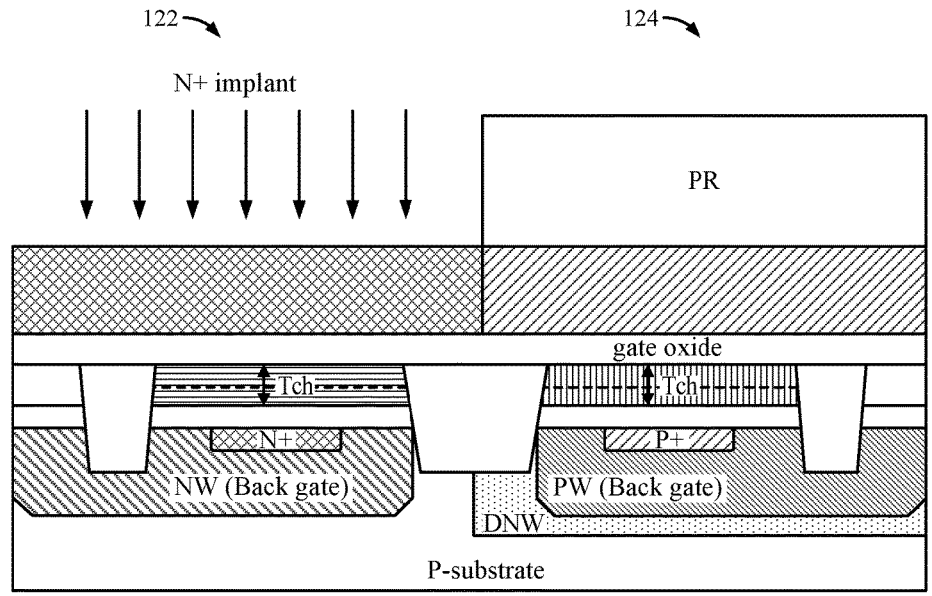
Figure 2K:
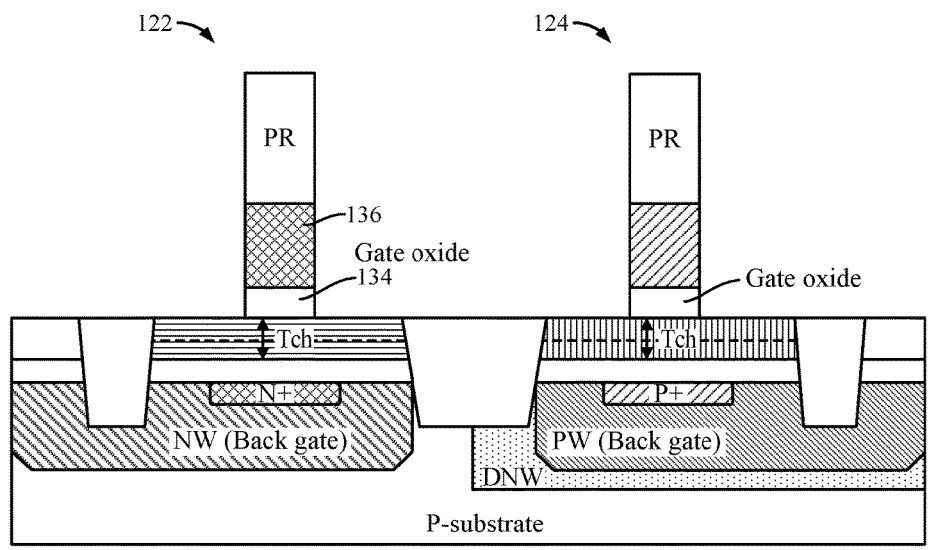
Figure 2L:
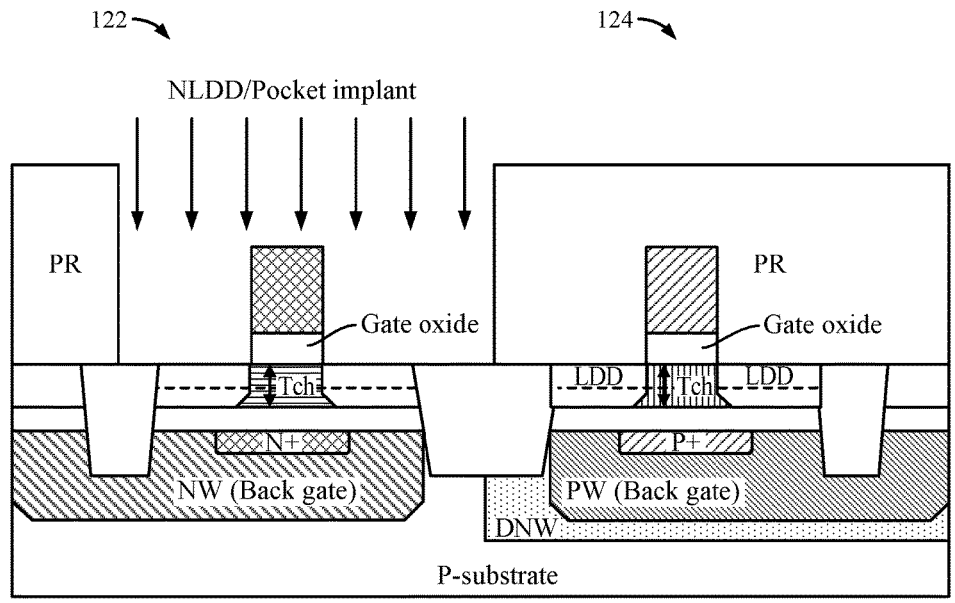
Figure 2M:
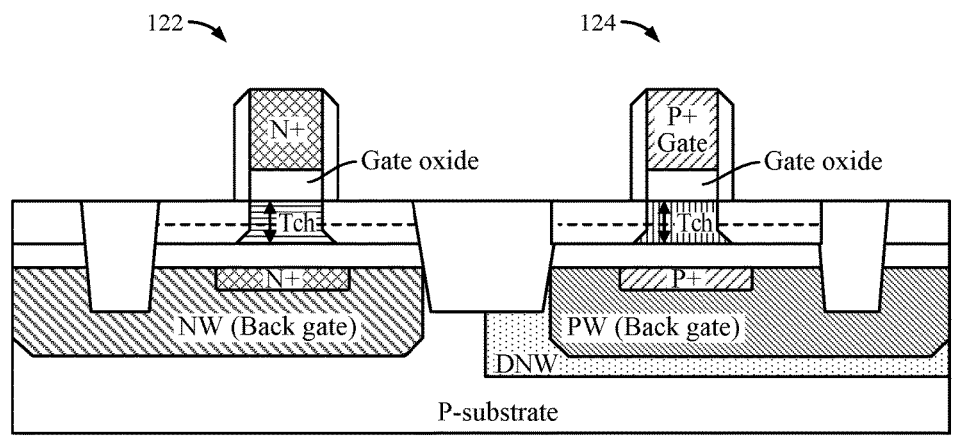
Figure 2N:
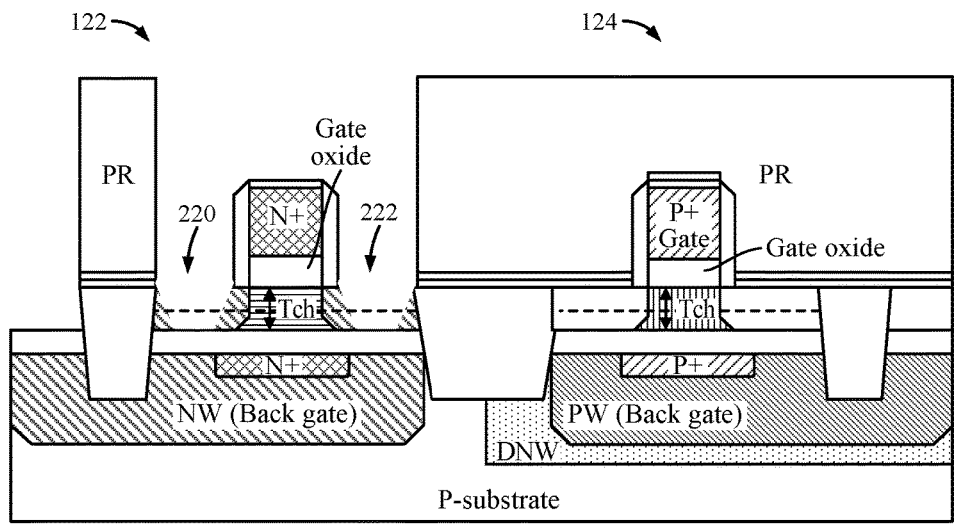
Figure 2O:
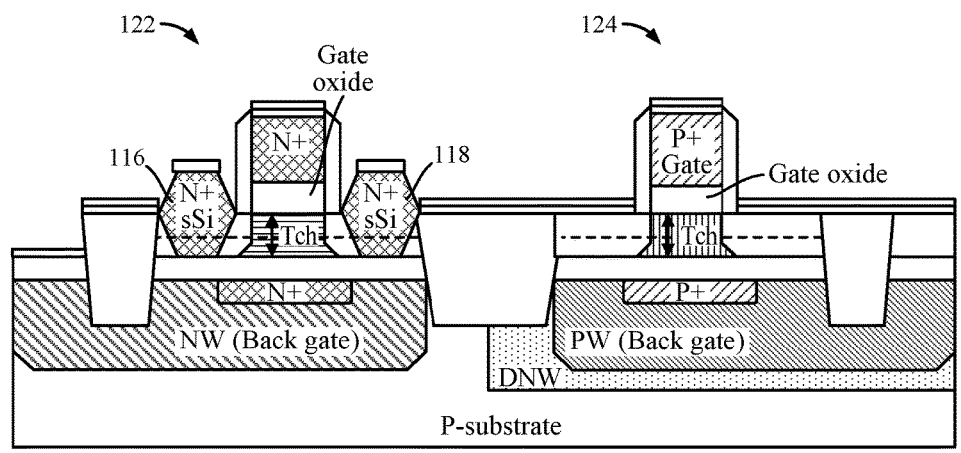
Figure 2P:
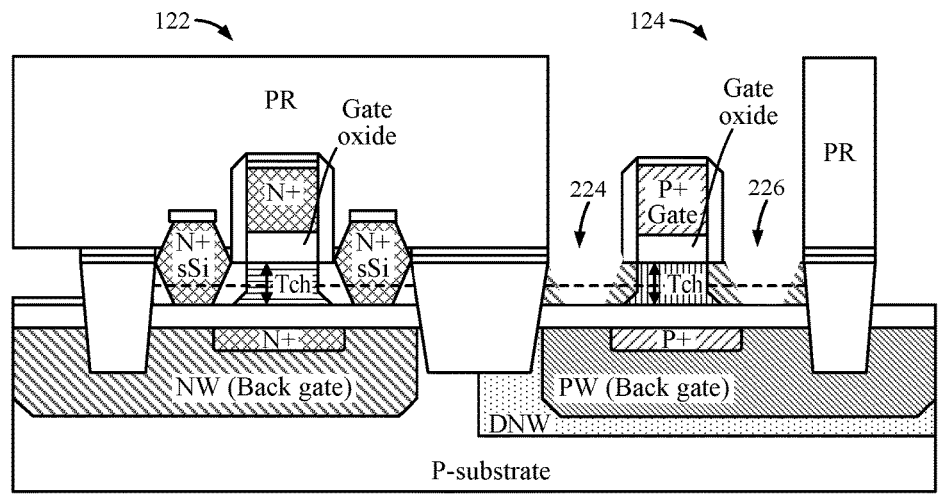
Figure 2Q:
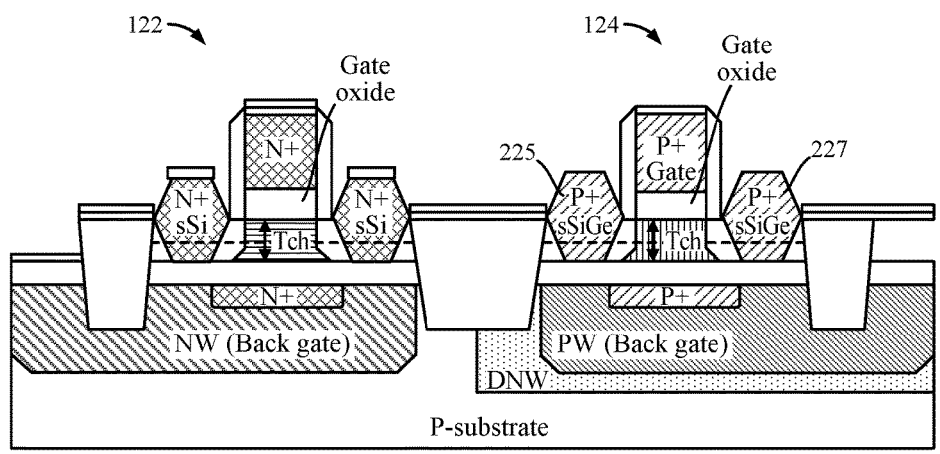
Figure 2R:
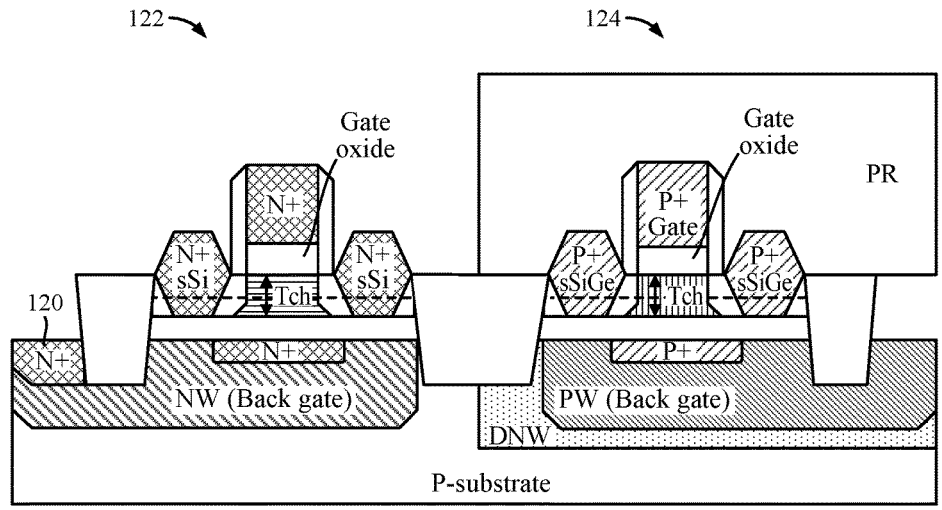
Figure 2S:
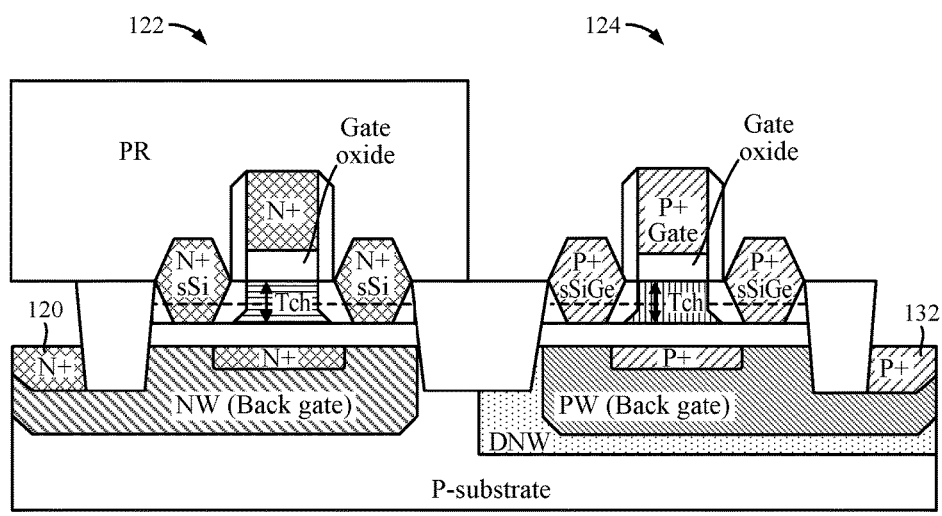
Figure 2T:
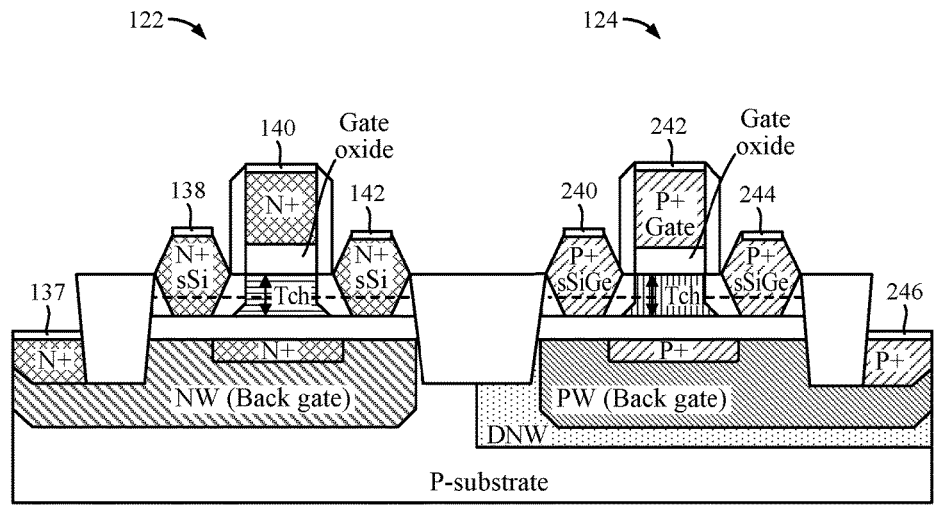

FIGS. 2A-2T illustrate an example process for fabricating a semiconductor device, in accordance with certain aspects of the present disclosure. In certain aspects, the example process for fabricating the semiconductor device may be implemented using a graphene-based layer transfer process. For example, a graphene layer 204 may be formed on a donor wafer 202 using a graphitization process at 1200 to 1400 Celsius or the graphene layer may be transferred onto the donor wafer. In certain aspects, the graphene layer 204 may be a 2D thin layer of carbon atoms that may be bonded together to form a hexagonal honeycomb lattice.

The graphene layer allows for the formation of an epilayer on the graphene that can be subsequently removed and placed on a host wafer. For example, as illustrated in FIG. 2B, a channel 206 is formed on the graphene layer 204 (e.g., using a Van der Waals epitaxy semiconductor single crystal channel material layer on graphene). The channel 206 may be implemented material using silicon, silicon germanium, germanium, or any material corresponding to type III-V process technology. An oxide layer 208 may be formed on the channel 206 to serve as a protection layer, as well as a nickel (Ni) stressor metal layer 210. As illustrated in FIG. 2C, a thermal handle tape 212 may be deposited on top of Ni stressor metal layer 210 such that the channel 206 can be mechanically exfoliated from the graphene layer 204 using the handle tape.

As illustrated in FIG. 2D, gate regions for the NMOS device 122 and PMOS device 124 are formed separately from the channel 206. For example, DNW, NW, and PW mask photo-resist (PR) openings are formed for the formation of the DNW region 126, NW region 102, and PW region 128 on the substrate 104, followed by DNW, NW, and PW implantation and photo-resist (PR) strip. Back gate mask PR openings are then formed, followed by N+ and P+ implantation to form N+ and P+ regions 106 and 130, followed by PR strip. Once the back gate regions for the NMOS device 122 and PMOS device 124 are formed as illustrated in FIG. 2D, the back gate oxide (e.g., back gate oxide 108) is formed as illustrated in FIG. 2E. At this point, the channel 206 is disposed (bonded) on the back gate oxide 108, as illustrated in FIG. 2F. For example, the channel 206 is directly bonded to the substrate wafer. Thermal de-tape is used to release the thermal handle tape 212. Using ferric chloride (FeCl3) based solution, the Ni stressor metal layer 210 may be removed, followed by wet etch and wafer cleaning.

As illustrated in FIG. 2G, SiN hard-mask (HM) 214 is then deposited on the oxide layer 208, followed by shallow trench isolation (STI) PR formation and etching to form the STI regions 216, 144, 218, followed by PR strip and cleaning. As illustrated in FIG. 2H, STI oxide is deposited in the STI region 216, STI region 144, and STI region 218, followed by chemical-mechanical polishing (CMP), oxide dip and SiN removal, to form the STI region 216, STI region 144, and STI region 218. In certain aspects, mask photoresist may be used to expose the NMOS device 122 and PMOS device 124 separately, to separately form n-type and p-type threshold implant regions (Vt), followed by PR strip and cleaning, as illustrated in FIG. 2I. As illustrated in FIG. 2J, the gate oxide is then grown or deposited, followed by poly deposition and N+ poly implant using PR N+ mask, and P+ poly implant using PR P+ mask and PR strip and cleaning.

As illustrated in FIG. 2K, PR patterning is used to etch the gate regions, followed by the formation of the lightly doped regions (e.g., lightly doped drain (LDD) regions), as illustrated in FIG. 2L. For example, PR mask may be used to expose regions where the lightly doped regions are to be used, followed by LDD implantation, and PR stripe and cleaning. As illustrated in FIG. 2M, this is followed by SiN deposition and etching back to form dielectric spacers adjacent to the front gate regions of the NMOS device 122 and PMOS device 124.

As illustrated in FIG. 2N, N+ mask photo and etch process is used to form recess areas 220 and 222 to form (epitax) the N+ regions 116 and 118, followed by PR strip and cleaning. For example, epitaxial N+ strained silicon (sSi) or (SiC) may be used to elevate the source/drain (S/D) region (e.g., N+ regions 116 and 118), as illustrated in FIG. 2O. Silicon nitride (SiN) is then deposited to cover the NMOS device 122 and PMOS device 124.

Similarly, a P+ mask photo and etch process may be used to form recess areas 224 and 226, followed by PR stripe and clean, as illustrated in FIG. 2P. As illustrated in FIG. 2Q, epitaxial P+ silicon germanium (SiGe) may be deposited to elevate the S/D regions 225 and 227 for the PMOS device 124. As illustrated in FIGS. 2R and 2S, N+ and P+ PR and implantation is used to form N+ region 120 and P+ region 132 for the NMOS device 122 and PMOS device 124, respectively. This is followed by device anneal process and silicide formation to form silicide layers 137, 138, 140, 142, 240, 242, 244, and 246 for the S/D, gate, and back gate contacts of the NMOS device 122 and PMOS device 124, as illustrated in FIG. 2T.

Figure 3A:
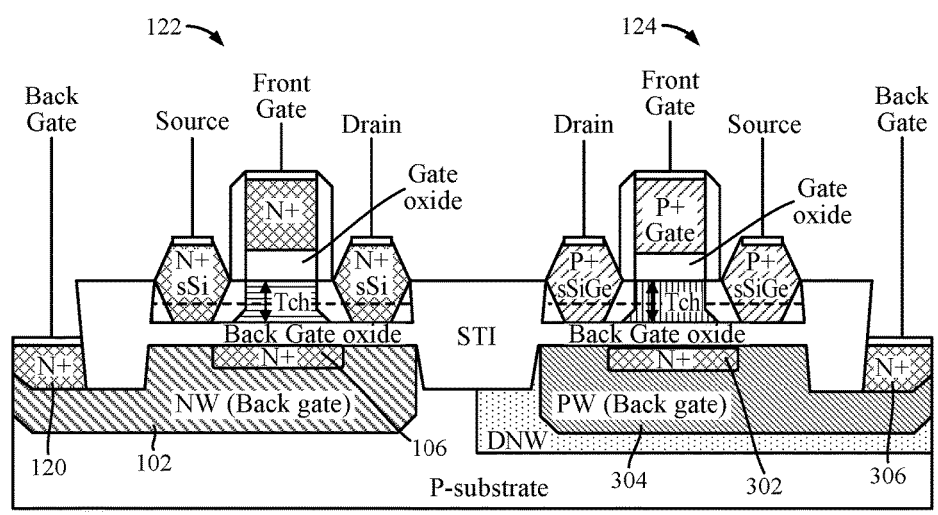
FIGS. 3A and 3L illustrate example configurations of a semiconductor device, in accordance with certain aspects of the present disclosure.

FIGS. 3A-3K illustrate different example configurations of a semiconductor device, in accordance with certain aspects of the present disclosure. For example, the semiconductor device may be implemented using n-type semiconductor for both the back gate regions (e.g., NW regions 102 and 304, and N+ regions 120, 106, 302, and 306) of the NMOS device 122 and PMOS device 124, as illustrated in FIG. 3A.

Figure 3B:
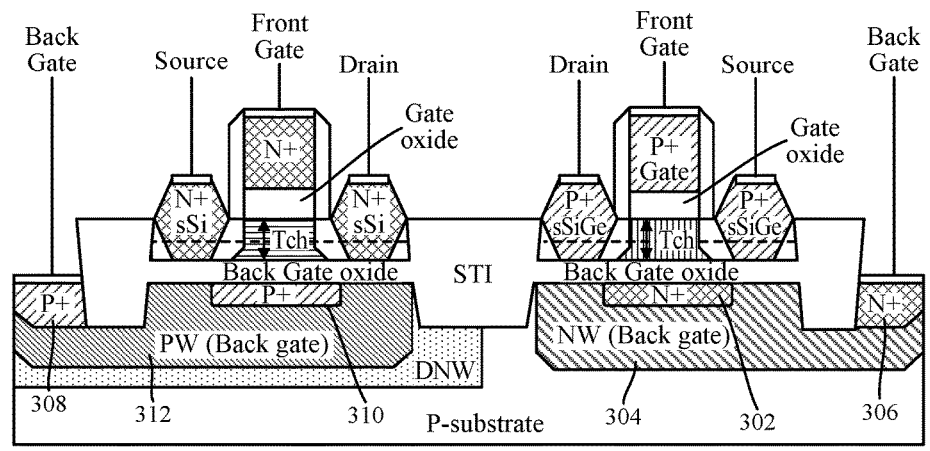
Figure 3C:
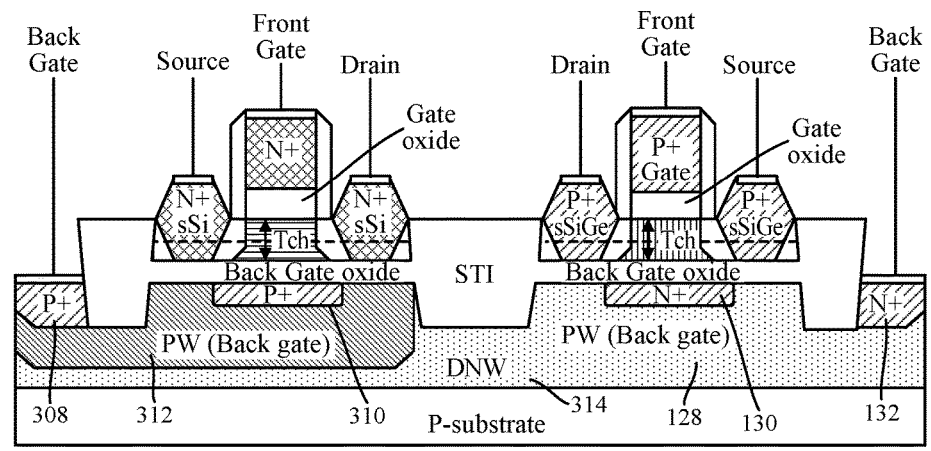
Figure 3D:
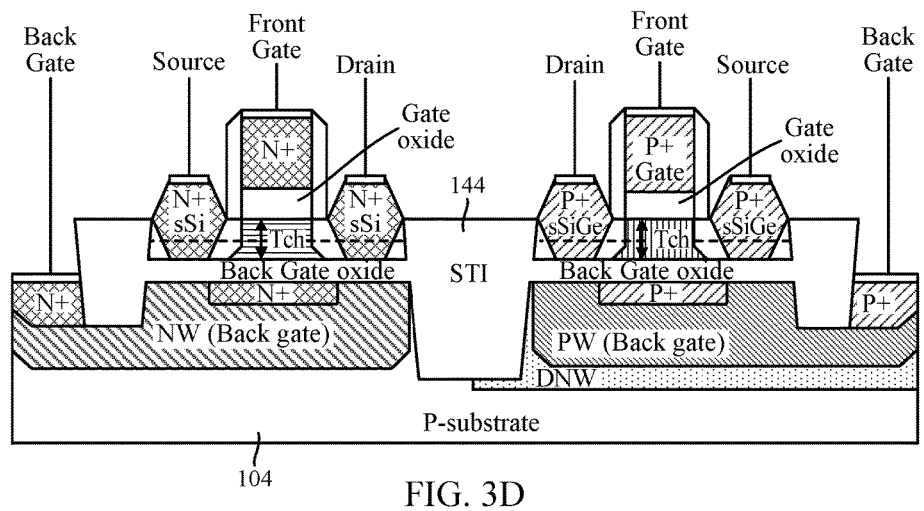
Figure 3E:
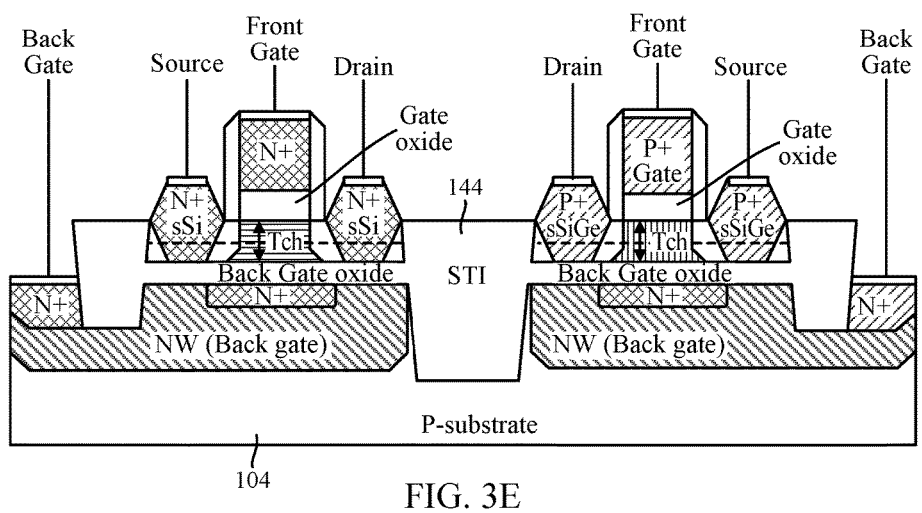
Figure 3F:
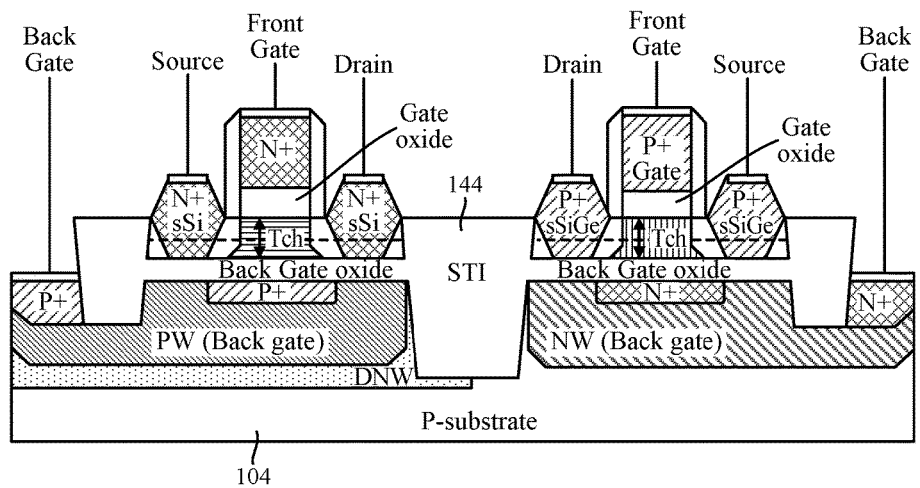
Figure 3G:
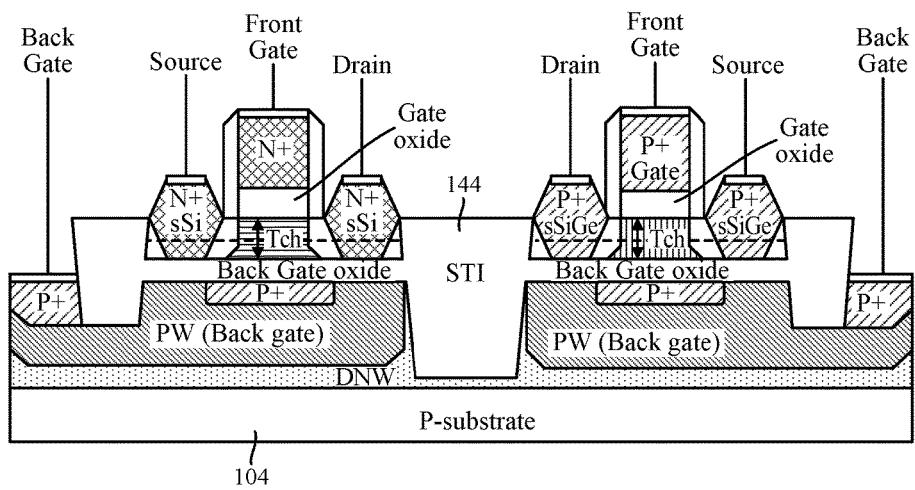
Figure 3H:
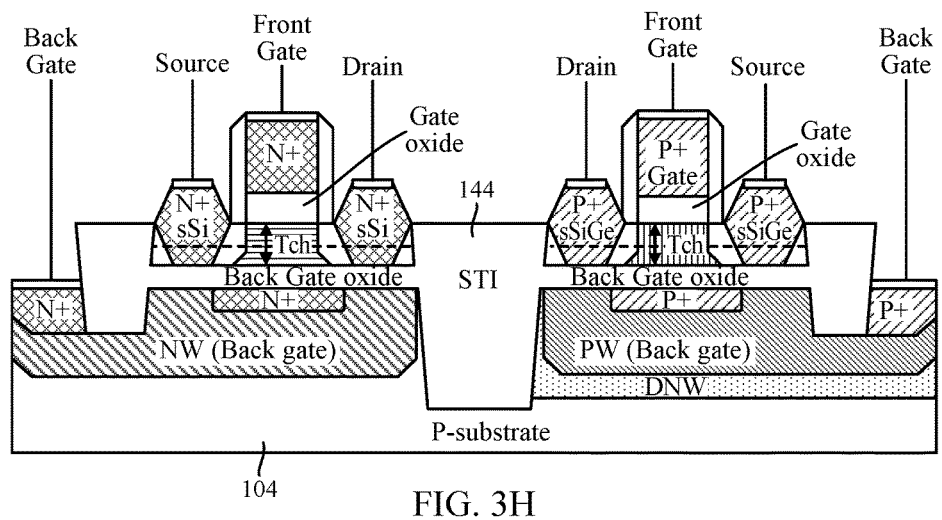
Figure 3I:
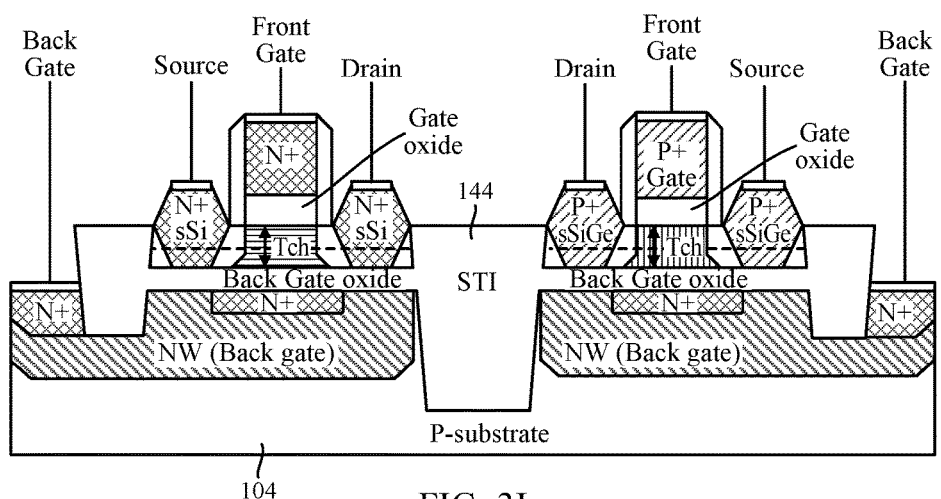
Figure 3J:
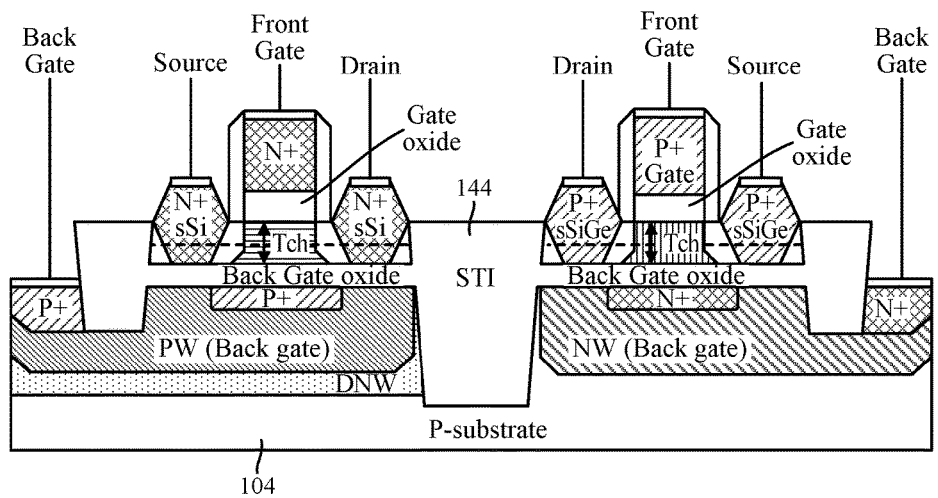
Figure 3K:
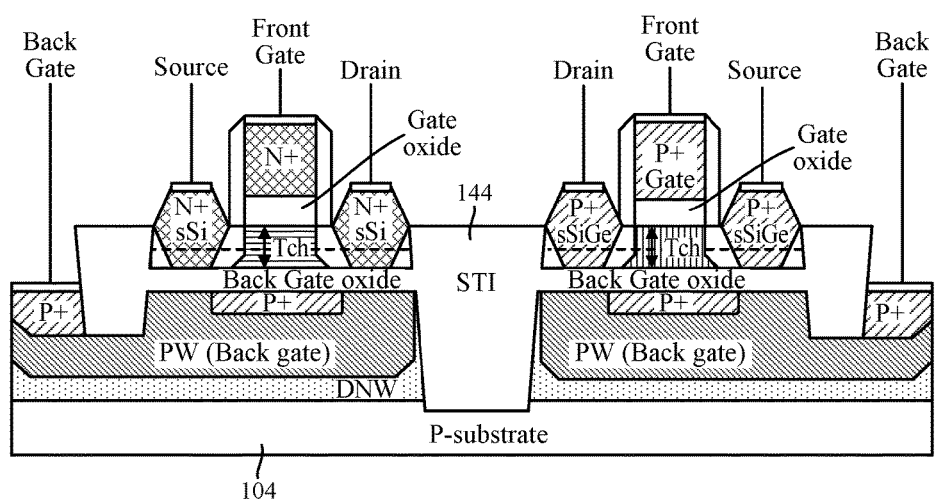

As illustrated in FIG. 3B, the semiconductor device may be implemented with p-type semiconductor (e.g., PW region 312, and P+ regions 308 and 310) for the NMOS device 122 and n-type semiconductor for the PMOS device 124. In some aspects, the semiconductor device may be implemented with p-type semiconductor for the back gate of both the NMOS device 122 and PMOS device 124, as illustrated in FIG. 3C. In this case, the same DNW region 314 may be disposed below both the back gate regions of the NMOS device 122 and PMOS device 124.

In certain aspects, the semiconductor device may be implemented with the STI region 144 formed deeper into the substrate 104. For example, FIGS. 3D, 3E, 3F and 3G illustrate the semiconductor device with a similar configuration as the semiconductor devices of FIGS. 1, 3A, 3B, and 3C, but with the STI region 144 that is formed deeper into the substrate 104, as illustrated. Moreover, FIGS. 3H, 3I, 3J, 3K illustrate the semiconductor device 100 with a similar configuration as the semiconductor device of FIGS. 3D, 3E, 3F and 3G, but with the STI region 144 that is formed deeper into the substrate 104, as illustrated.

Figure 3L:
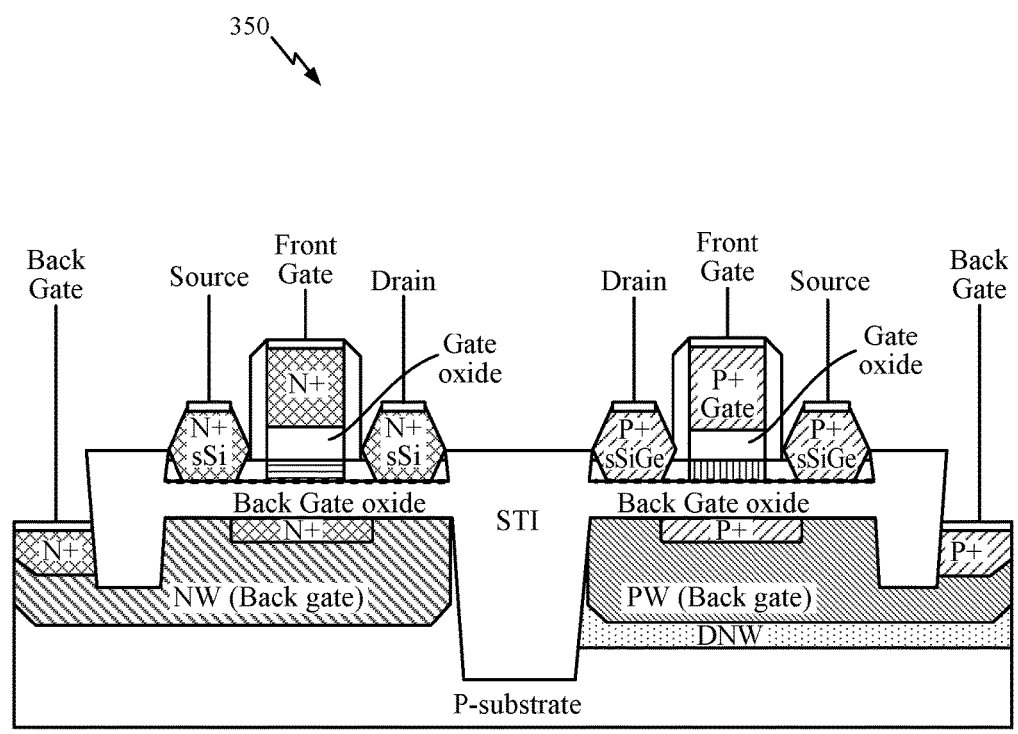

FIG. 3L illustrates an example configuration of a semiconductor device 350 having a thicker back gate oxide as compared to the front gate oxide, in accordance with certain aspects of the present disclosure. In certain aspects, the back gate oxide may be thinner than a FD-SOI device BOX layer, such that the back gate bias voltage can be reduced for low power application. Moreover, the channel thickness may be about the same as the thickness of a FD-SOI device channel.

Aspects of the present disclosure allow for a thick channel (e.g., 10-14 nm), a BOX (e.g., back gate oxide) thickness that is about the same as the front gate oxide, and a strong back gate effect. Aspects of the present disclosure also allow for better scaling of the semiconductor device as compared to a conventional FD-SOI semiconductor device, with reduced cost.

Figure 4:
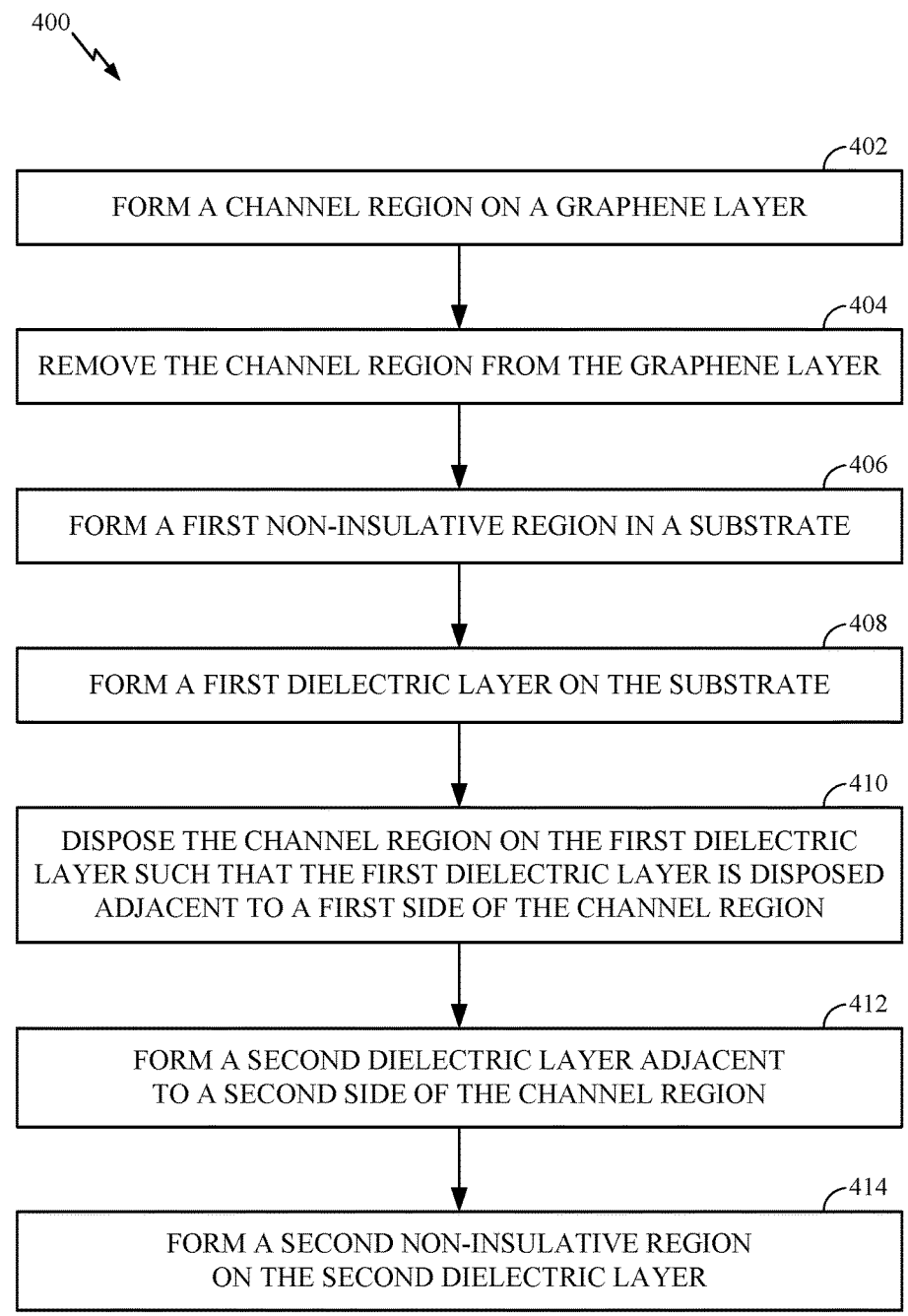
FIG. 4 is a flow diagram of example operations for fabricating a semiconductor device, in accordance with certain aspects of the present disclosure.

FIG. 4 is a flow diagram of example operations 400 for fabricating a semiconductor device, in accordance with certain aspects of the present disclosure. The operations 400 may be performed, for example, by a semiconductor processing chamber.

The operations 400 may begin, at block 402, by forming a channel region (e.g., channel 110) on a graphene layer (e.g., graphene layer 204), and at block 404, removing the channel region from the graphene layer. At block 406, a first non-insulative region (e.g., N+ region 106) is formed in a substrate (e.g., substrate 104). At block 408, a first dielectric layer (e.g., back gate oxide 108) is formed on the substrate, and at block 410, the channel region is disposed on the first dielectric layer such that the first dielectric layer is disposed adjacent to a first side of the channel region. At block 412, a second dielectric layer (e.g., oxide layer 134) is formed adjacent to a second side of the channel region, and at block 414, a second non-insulative region (e.g., N+ region 136) is formed on the second dielectric layer.

In certain aspects, the first side and the second side are on opposite sides the channel region (e.g., as illustrated in FIG. 1). In certain aspects, the operations 400 also include forming a third non-insulative region (e.g., NW region 102) in the substrate, wherein the first non-insulative region is formed above the third non-insulative region. In certain aspects, the third non-insulative region has a same doping type and different doping concentration than the first non-insulative region. In some cases, the first non-insulative region is a p+ region, and the third non-insulative region is a p-well region. In other cases, the first non-insulative region is an n+ region, and the third non-insulative region is an n-well region. In certain aspects, the operations 400 also include forming a fourth non-insulative region (e.g., n+ region 120) above the third non-insulative region, wherein the fourth non-insulative region has the same doping type and different doping concentration than the third non-insulative region. In certain aspects, the operations 400 also include forming a STI region adjacent to the third non-insulative region. In some cases, the fourth non-insulative region is formed such that the STI region is disposed between the first non-insulative region and the fourth non-insulative region.

In certain aspects, the operations 400 include forming a third non-insulative region (e.g., N+ region 116) adjacent to a third side of the channel region, and forming a fourth non-insulative region (e.g., N+ region 118) adjacent to a fourth side of the channel region. In certain aspects, the operations 400 also include forming a first lightly doped drain (LDD) region after disposing the channel region on the first dielectric and such that the first LDD region is formed between the third non-insulative region and the channel region, and forming a second LDD region after disposing the channel region on the first dielectric and such that the second LDD region is formed between the fourth non-insulative region and the channel region. In certain aspects, the operations 400 also include forming a silicide layer (e.g., silicide layers 138, 140 and 142) above each of the second non-insulative region, third non-insulative region, and the fourth non-insulative region.

In certain aspects, the first dielectric layer and the second dielectric layer are formed such that the first dielectric layer and the second dielectric layer have the same thickness. In some cases, the first dielectric layer and the channel region are formed such that a thickness of the first dielectric layer is less than a thickness of the channel region.

Figure 5:
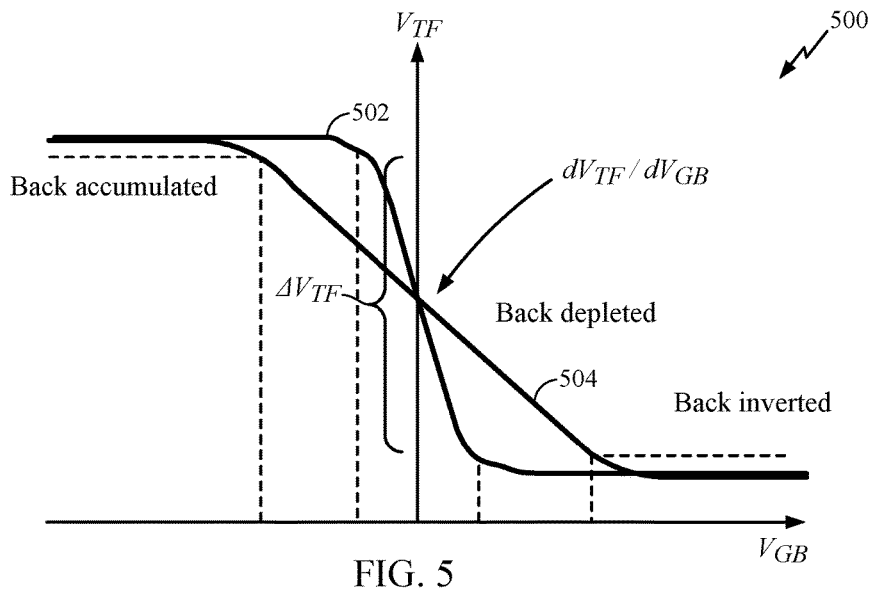
FIG. 5 is a graph illustrating the front gate threshold voltage ($V_{TF}$) as a function of the back gate voltage ($V_{GB}$) for an example semiconductor device, in accordance with certain aspects of the present disclosure.

FIG. 5 is a graph 500 illustrating the front gate threshold voltage ($V_{TF}$) as a function of the back gate voltage ($V_{GB}$) for an example semiconductor device (e.g., semiconductor device 100), in accordance with certain aspects of the present disclosure. Line 502 represents the $V_{TF}$ of the example semiconductor device of the present disclosure, and line 504 illustrates the $V_{TF}$ of a conventional FD-SOI semiconductor device. As illustrated, the $V_{TF}$ represented by line 502 can be controlled with a smaller change to $V_{GB}$ as illustrated by the increased slope $dV_{TF}/dV_{GB}$.

Figure 6:
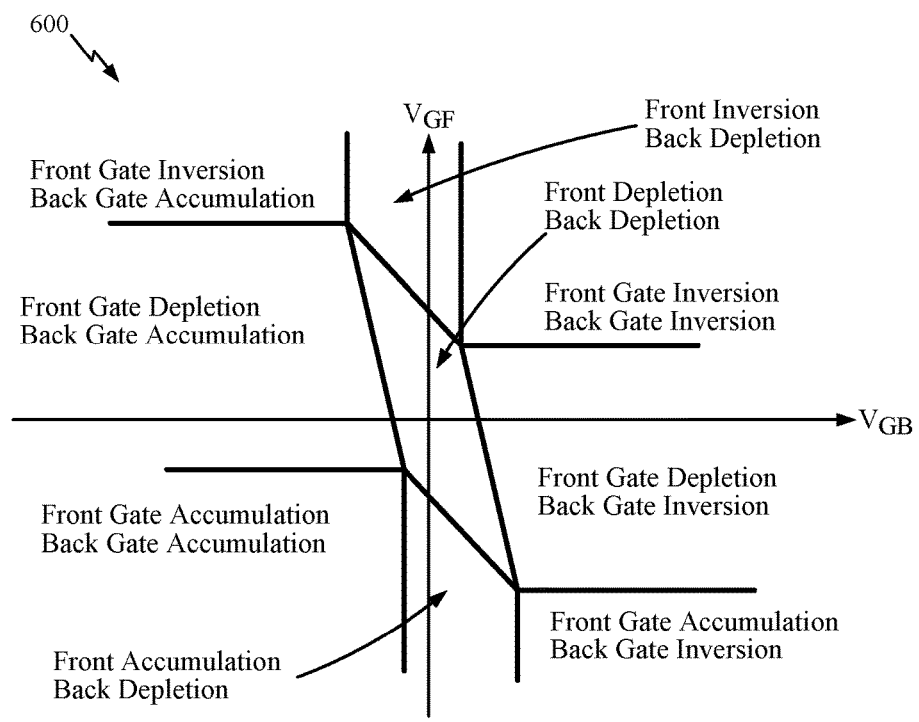
FIG. 6 is a graph illustrating various operating modes of an example semiconductor device, in accordance with certain aspects of the present disclosure.

FIG. 6 is a graph 600 illustrating various operating modes of an example semiconductor device (e.g., the semiconductor device 100), in accordance with certain aspects of the present disclosure. Aspects of the present disclosure allow for the back gate and the front gate to be controlled separately, increasing the number of operating modes for the semiconductor device. For example, the front gate and back gate can be separately biased in an accumulation, inversion, or depletion mode of operation by adjusting the front gate voltage ($V_{GF}$) and the back gate voltage ($V_{GB}$).

Figure 7:
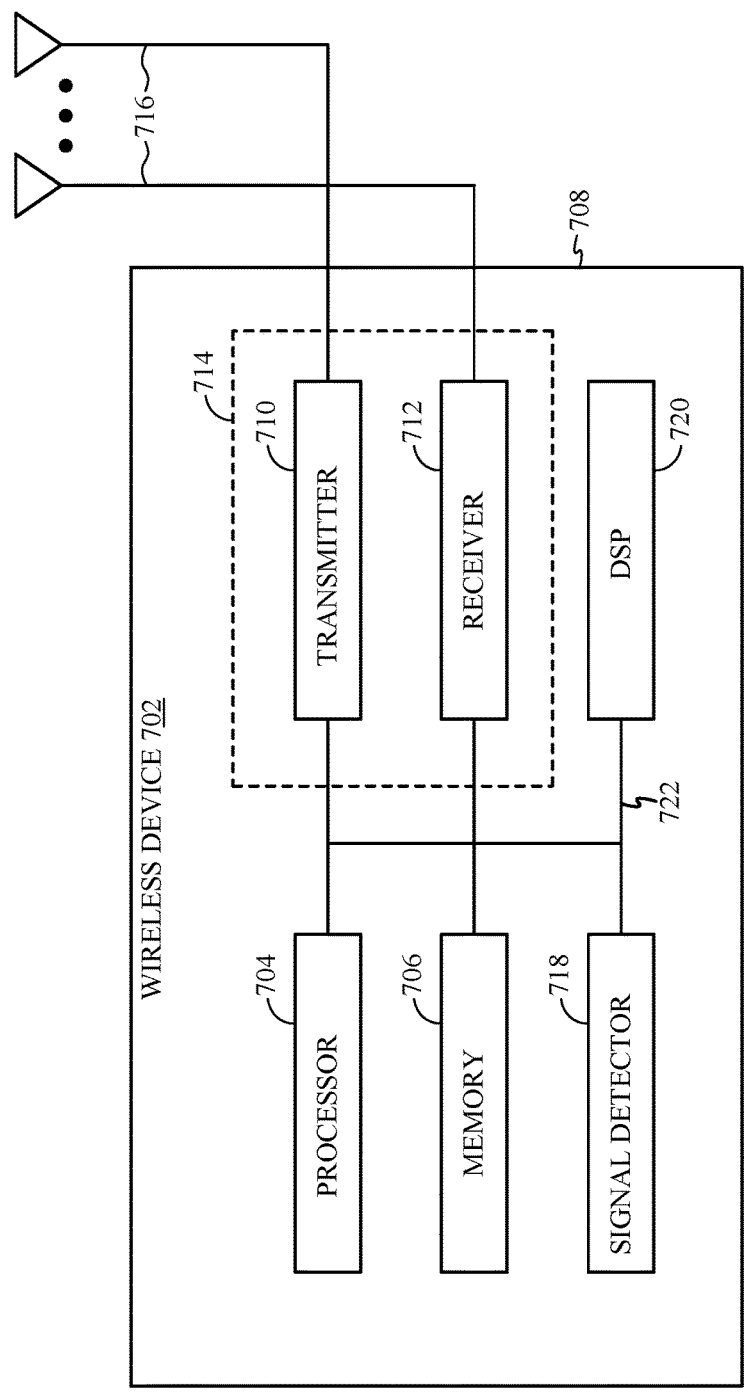
FIG. 7 illustrates a wireless device, in accordance with certain aspects of the present disclosure.

FIG. 7 illustrates various components that may be used in a wireless device 702 (e.g., mobile device). The wireless device 702 is an example of a device that may include the semiconductor device 100. That is, the wireless device 702 may include one or more circuits, implemented with semiconductor devices having a configuration as described with respect to the semiconductor device 100. For example, the wireless device 702 may include a processor 704 which controls operation of the wireless device 702. The processor 704 may also be referred to as a central processing unit (CPU). Memory 706, which may include both read-only memory (ROM) and random access memory (RAM), provides instructions and data to the processor 704. A portion of the memory 706 may also include non-volatile random access memory (NVRAM). The processor 704 typically performs logical and arithmetic operations based on program instructions stored within the memory 706. The instructions in the memory 706 may be executable to implement the methods described herein.

The wireless device 702 may also include a housing 708 that may include a transmitter 710 and a receiver 712 to allow transmission and reception of data between the wireless device 702 and a remote node. In some cases, such as a half-duplex system (e.g., wireless local area network (WLAN)), the transmitter 710 and the receiver 712 may be combined. The transmitter 710 and receiver 712 may be combined into a transceiver 714. A single or a plurality of transmit antennas 716 may be attached to the housing 708 and electrically coupled to the transceiver 714. The wireless device 702 may also include (not shown) multiple transmitters, multiple receivers, and multiple transceivers.

The wireless device 702 may also include a signal detector 718 that may be used in an effort to detect and quantify the level of signals received by the transceiver 714. The signal detector 718 may detect such signals as total energy, energy per subcarrier per symbol, power spectral density and other signals. The wireless device 702 may also include a digital signal processor (DSP) 720 for use in processing signals.

The various components of the wireless device 702 may be coupled together by a bus system 722, which may include a power bus, a control signal bus, and a status signal bus in addition to a data bus.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor device, comprising:
    a substrate;
    a first non-insulative region disposed above the substrate;
    a second non-insulative region disposed above the first non-insulative region, wherein the first and second non-insulative regions have the same doping type and different doping concentrations;
    a first dielectric layer;
    a channel region, wherein the first dielectric layer is disposed adjacent to a first side of the channel region;
    a second dielectric layer disposed adjacent to a second side of the channel region;
    a third non-insulative region disposed above the second dielectric layer;
    a fourth non-insulative region disposed adjacent to a third side of the channel region; and
    a fifth non-insulative region disposed adjacent to a fourth side of the channel region.

2. The semiconductor device of claim 1, wherein the first non-insulative region comprises a p-well region, and the second non-insulative region comprises a p+ region.

3. The semiconductor device of claim 1, wherein the first non-insulative region comprises an n-well region, and the second non-insulative region comprises an n+ region.

4. The semiconductor device of claim 1, wherein the first side and the second side are opposite sides of the channel region.

5. The semiconductor device of claim 1, wherein the first dielectric layer and the second dielectric layer have the same thickness.

6. The semiconductor device of claim 1, wherein a thickness of the first dielectric layer is less than a thickness of the channel region.

7. The semiconductor device of claim 1, further comprising a silicide layer disposed above each of the third non-insulative region, the fourth non-insulative region, and the fifth non-insulative region.

8. The semiconductor device of claim 1, further comprising:
    a first lightly doped drain (LDD) region disposed between the fourth non-insulative region and the channel region; and
    a second LDD region disposed between the fifth non-insulative region and the channel region.

9. The semiconductor device of claim 1, further comprising a sixth non-insulative region disposed above the first non-insulative region, wherein the sixth non-insulative region has the same doping type and different doping concentration than the first non-insulative region.

10. The semiconductor device of claim 9, further comprising:
    a shallow trench isolation (STI) region disposed above the first non-insulative region.

11. The semiconductor device of claim 10, wherein the STI region is disposed between the second non-insulative region and the sixth non-insulative region.

12. The semiconductor device of claim 1, further comprising:

a deep n-well region disposed between the first non-insulative region and the substrate.

13. The semiconductor device of claim 1, further comprising:
    a sixth non-insulative region disposed above the substrate;
    a seventh non-insulative region disposed above the sixth non-insulative region, wherein the sixth and seventh non-insulative regions have the same doping type and different doping concentrations;
    a third dielectric layer;
    another channel region, wherein the third dielectric layer is disposed adjacent to a first side of the other channel region;
    a fourth dielectric layer disposed adjacent to a second side of the other channel region;
    an eight non-insulative region disposed above the fourth dielectric layer;
    a ninth non-insulative region disposed adjacent to a third side of the other channel region;
    a tenth non-insulative region disposed adjacent to a fourth side of the other channel region; and
    a shallow trench isolation (STI) region disposed between the second non-insulative region and the seventh non-insulative region.

14. The semiconductor device of claim 13, wherein the STI region is formed deeper into the substrate as compared to the first non-insulative region and the sixth non-insulative region.

15. A mobile device, comprising:
    one or more semiconductor devices, each of the semiconductor devices comprising:
        a substrate;
        a first non-insulative region disposed above the substrate;
        a second non-insulative region disposed above the first non-insulative region, wherein the first and second non-insulative regions have the same doping type and different doping concentrations;
        a first dielectric layer;
        a channel region, wherein the first dielectric layer is disposed adjacent to a first side of the channel region;
        a second dielectric layer disposed adjacent to a second side of the channel region;
        a third non-insulative region disposed above the second dielectric layer;
        a fourth non-insulative region disposed adjacent to a third side of the channel region; and
        a fifth non-insulative region disposed adjacent to a fourth side of the channel region.

* * * * *